US008570108B2

(12) United States Patent
Ragunathan et al.

(10) Patent No.: US 8,570,108 B2
(45) Date of Patent: Oct. 29, 2013

(54) INJECTION-LOCKING A SLAVE OSCILLATOR TO A MASTER OSCILLATOR WITH NO FREQUENCY OVERSHOOT

(75) Inventors: Ashwin Ragunathan, San Diego, CA (US); Marzio Pedrali-Noy, San Diego, CA (US); Sameer Wadhwa, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 83 days.

(21) Appl. No.: 13/204,401

(22) Filed: Aug. 5, 2011

(65) Prior Publication Data

US 2013/0033331 A1    Feb. 7, 2013

(51) Int. Cl.
*H03L 7/24*    (2006.01)
*H03K 3/03*    (2006.01)

(52) U.S. Cl.
USPC ............... 331/47; 331/50; 331/55; 331/57; 331/74; 331/76; 331/172

(58) Field of Classification Search
USPC ............ 331/2, 45–50, 55, 57, 74, 76, 172, 331/DIG. 2
See application file for complete search history.

(56) References Cited

U.S. PATENT DOCUMENTS

| | | | | |
|---|---|---|---|---|
| 3,304,518 A | * | 2/1967 | Mackey | 332/144 |
| 3,713,041 A | * | 1/1973 | Sakamoto et al. | 331/44 |
| 3,832,713 A | * | 8/1974 | Rubin | 342/371 |
| 4,282,493 A | * | 8/1981 | Moreau | 331/2 |
| 5,631,933 A | | 5/1997 | Chu et al. | |
| 6,850,122 B2 | * | 2/2005 | Ravi et al. | 331/46 |
| 6,937,107 B2 | * | 8/2005 | Ravi et al. | 331/47 |
| 7,952,438 B2 | * | 5/2011 | Song et al. | 331/51 |
| 2005/0104666 A1 | | 5/2005 | Rebel | |

OTHER PUBLICATIONS

Fischer, T. et al. "A 90-nm Variable Frequency Clock System for a Power-Managed Itanium Architecture Processor," IEEE Journal of Solid-State Circuits, vol. 41, No. 1, Jan. 2006, pp. 218-228.
Kurd, N. et al. (Apr. 2009) "Next Generation Intel Core Micro-Architecture (Nehalem) Clocking," IEEE Journal of Solid-State Circuits, vol. 44, No. 4, pp. 1121-1129.
Kurd N., et al., "Next Generation Intel® Micro-architecture (Nehalem) Clocking Architecture," Symposium on VLSI Circuits Digest of Technical Papers, 2008, 62-63.

(Continued)

*Primary Examiner* — Levi Gannon
(74) *Attorney, Agent, or Firm* — Kenyon S. Jenckes

(57) ABSTRACT

An injection-locked oscillator circuit includes a master oscillator, a slave oscillator, and an injection lock control circuit. The slave oscillator is decoupled from the master oscillator (for example, due to an unlock condition). When the slave is free running, its oscillating frequency is adjusted (for example, as a function of a supply voltage). After an amount of time, the slave is to be relocked to the master (for example, due to the unlock condition no longer being present). The slave oscillating frequency is made to be slightly lower than the master oscillating frequency. The slave is then only recoupled to the master upon detection of an opposite-phase condition between the master oscillator output signal and the slave oscillator output signal. By only recoupling the slave to the master during opposite-phase conditions, frequency overshoots in the slave oscillating frequency are avoided that may otherwise occur were the recoupling done during in-phase conditions.

25 Claims, 8 Drawing Sheets

(56) References Cited

OTHER PUBLICATIONS

Mesgarzadeh, B. et al. "First-Harmonic Injection-Locked Ring Oscillators," IEEE 2006 Custom Integrated Circuits Conference (CICC), pp. 733-736, Sep. 10-13, 2006, doi: 10.1109/CICC.2006.320927.

Verma, S. "A Unified Model for Injection-Locked Frequency Dividers," IEEE Journal of Solid-State Circuits, vol. 38, No. 6, Jun. 2003, pp. 1015-1027.
International Search Report and Written Opinion—PCT/US2012/049224—ISA/EPO—May 3, 2013.

* cited by examiner

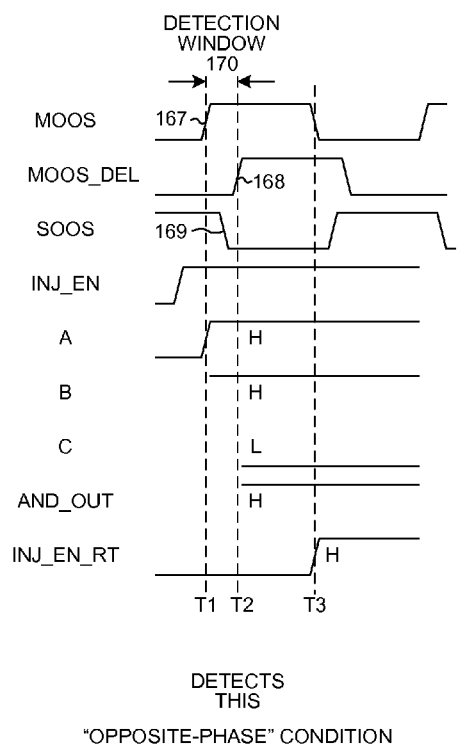
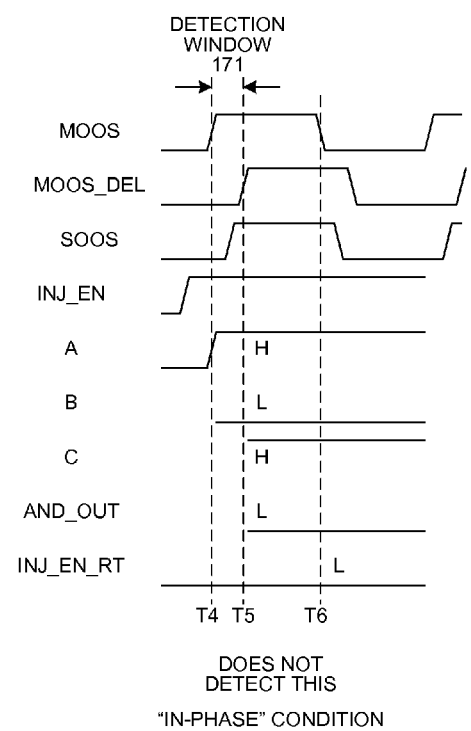
FIG. 4
FIG. 5

INJECTION-LOCKING A SLAVE OSCILLATOR TO A MASTER OSCILLATOR WITH NO FREQUENCY OVERSHOOT

BACKGROUND INFORMATION

1. Technical Field

The present disclosure relates to Injection-Locked Oscillators (ILOs).

2. Background Information

A type of oscillator referred to as an Injection-Locked Oscillator (ILO) involves a first oscillator, often referred to as a master oscillator, and a second oscillator, often referred to as a slave oscillator. Energy from the master oscillator is coupled into the slave oscillator in such a way that the oscillating frequency of the slave oscillator is a desired integer multiple or sub-multiple of the oscillating frequency of the master oscillator. ILOs see many uses including uses in clock signal generation and in clock distribution. In some examples, the master oscillator is a Voltage-Controlled Oscillator (VCO) that is part of a Phase-Locked Loop (PLL). The slave oscillator is injection-locked to the master and supplies a clock signal of a desired frequency to other circuitry.

SUMMARY

An injection-locked oscillator circuit includes a master oscillator, a slave oscillator, and an injection lock control circuit. Initially, the master oscillator and the slave oscillator are operated such that the slave oscillator is injection-locked to the master oscillator. The slave oscillator is used to clock another circuit such as a processor circuit where the processor circuit is powered from a supply voltage. Next, the slave oscillator is decoupled from the master oscillator. In one example, the slave oscillator is decoupled from the master oscillator as a result of an unlock condition detector circuit detecting an unlock condition. The unlock condition may be a condition of the supply voltage of the processor circuit falling below a normal supply voltage range. The normal supply voltage range is also referred to as the tolerance voltage range of the supply voltage.

After decoupling, when the slave oscillator is free running, the oscillating frequency of the slave oscillator is adjusted. In one example, the free running oscillating frequency of the slave oscillator is adjusted so that it varies in proportion to the supply voltage supplied to the processor circuit. If the supply voltage decreases, then the free running oscillating frequency of the slave oscillator is decreased. If the supply voltage increases, then the free running oscillating frequency of the slave oscillator is increased. After an amount of time of free running operation, the slave oscillator is then to be relocked to the master oscillator. In one example, the slave oscillator is to be relocked to the master oscillator once the unlock condition detector circuit no longer detects the unlock condition. The oscillating frequency of slave oscillator is adjusted to and is left at a frequency that is slightly lower than but very close to the oscillating frequency of the master oscillator. The slave oscillator is then only recoupled to the master oscillator upon detection of an opposite-phase condition between the master oscillator output signal and the slave oscillator output signal. By only recoupling the slave oscillator to the master oscillator during opposite-phase conditions, frequency overshoots in the slave oscillating frequency that might otherwise have occurred during the relocking process are avoided.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF THE DRAWINGS

FIG. 4 is a waveform diagram that illustrates an operation of the opposite-phase condition detector circuit of FIG. 3 in an opposite-phase condition.

FIG. 5 is a waveform diagram that illustrates an operation of the opposite-phase condition detector circuit of FIG. 3 in an in-phase condition.

DETAILED DESCRIPTION

Figure 1:
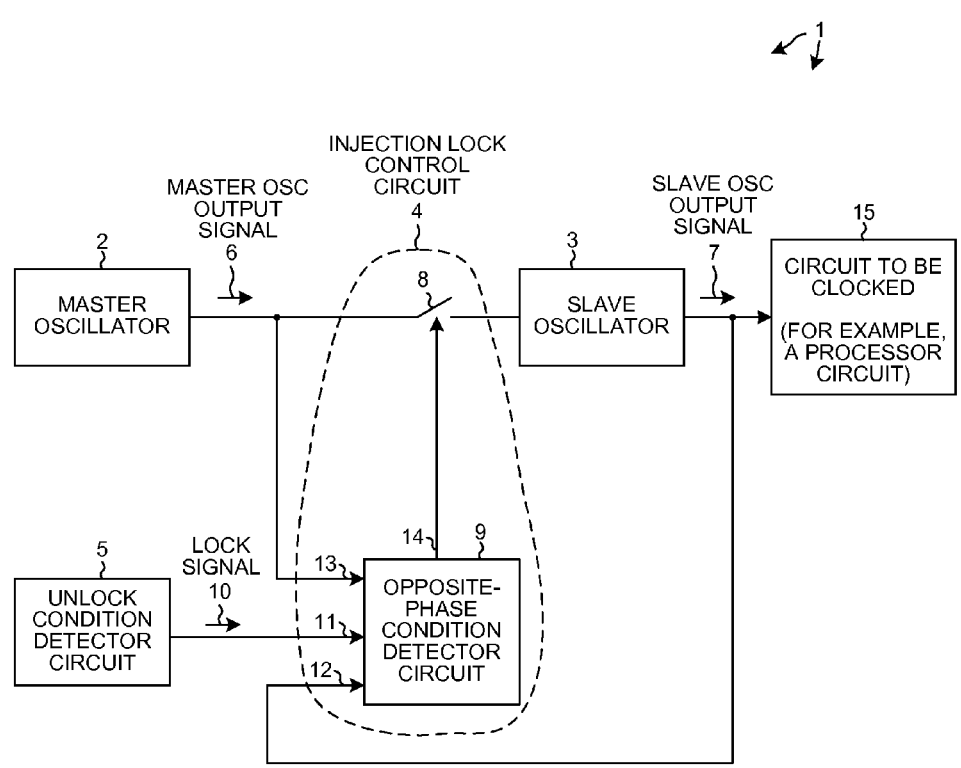
FIG. 1 is a diagram of an Injection-locked Oscillator (ILO) system in accordance with one novel aspect.

FIG. 1 is a diagram of an Injection-Locked Oscillator (ILO) system 1. System 1 includes a master oscillator 2, a slave oscillator 3, an injection lock control circuit 4, and an unlock condition detector circuit 5. Master oscillator 2, slave oscillator 3, and injection lock control circuit 4 together form an Injection-Locked Oscillator (ILO). Master oscillator 2 outputs a master oscillator output signal 6. Slave oscillator 3 outputs a slave oscillator output signal 7. Injection lock control circuit 4 includes a switch 8 and an opposite-phase condition detector circuit 9. In a locked condition, the switch 8 is in a closed state such that slave oscillator 3 is coupled to, and is injection-locked to, the master oscillator 2. As long as the unlock condition detector circuit 5 does not detect an unlock condition, the system 1 operates in this fashion with the slave oscillator 3 being injection-locked to the master oscillator 2.

If the unlock condition detector circuit 5 detects an unlock condition, then unlock condition detector circuit 5 deasserts a lock signal 10. Injection lock control circuit 4 receives the deasserted lock signal 10 and in response puts switch 8 into an open state. Injection lock control circuit 4 controls switch 8 by outputting an appropriate control signal onto output lead and node 14. Putting switch 8 into the open state decouples slave oscillator 3 from master oscillator 2. In one example, the free running oscillating frequency of slave oscillator 3 is of lower frequency than is the oscillating frequency of the master oscillator output signal 6. Therefore, upon decoupling, the frequency of the slave oscillator output signal decreases and settles at its lower free running oscillating frequency. This condition persists while the unlock condition persists.

Once the unlock condition not longer exists, the unlock condition detector circuit 5 asserts the lock signal 10. Assertion of lock signal 10 on input lead and node 11 is a prompt to the injection lock control circuit 4 to recouple the slave oscillator 3 to the master oscillator 2 when there is an opposite-phase condition between the slave oscillator output signal 7 and the master oscillator output signal 6. The opposite-phase condition detector circuit 9 receives the slave oscillator output signal 7 on input lead and node 12. The opposite-phase condition detector circuit 9 receives the master oscillator output signal 6 on input lead and node 13. Opposite-phase condition detector circuit 9 compares the slave and master oscillator output signals looking for an opposite-phase condition. In one example, an opposite-phase condition is a condition in which an edge of the slave-oscillator output signal occurs within a predetermined time window of an edge of the master oscillator output signal, but the edge of the slave oscillator output signal and the edge of the master oscillator output signal are of opposite types (i.e., one is a rising edge whereas the other is a falling edge). For example, within a predetermined time of a rising edge of the master oscillator output signal there is a falling edge of the slave oscillator output signal. Upon detecting the opposite-phase condition, the opposite-phase condition detector circuit 9 controls switch 8 to switch from its open state to its closed state, thereby recoupling slave oscillator 3 to master oscillator 2. By recoupling the slave oscillator to the master oscillator, the slave oscillator again becomes injection-locked to the master oscillator.

Were slave oscillator 3 recoupled to master oscillator 2 in an in-phase condition, a frequency overshoot in the slave oscillator output signal would occur. A frequency overshoot is a condition in which the slave oscillator output signal exhibits a transient perturbation in its oscillating frequency that is higher than the oscillating frequency of the master oscillator for a short amount of time after the recoupling occurs. In system 1, however, the injection lock control circuit 4 waits to recouple the slave oscillator 3 to the master oscillator 2 until there is an opposite-phase condition between the slave oscillator output signal 7 and the master oscillator output signal 6. Accordingly, a frequency overshoot due to recoupling the oscillators in an in-phase condition is avoided. Upon recoupling of the slave oscillator 3 to the master oscillator 2, the oscillating frequency of the slave oscillator might have a sudden frequency undershoot after which the oscillating frequency of the slave oscillator will settle to its final locked frequency in a first order fashion (similar to the step response of a single-pole RC filter). The relocking process thus occurs without any frequency overshoot of the slave oscillator output signal.

It has been recognized that there are circuits that are to be clocked by a clock signal where the frequency of the clock signal is advantageously decreased in some situations, but where the frequency of the clock signal should not exceed a particular maximum frequency. Block 15 represents one such circuit. One example of such a circuit is a processor circuit that is clocked by the slave oscillator output signal. The processor circuit is either directly clocked by the slave oscillator output signal or is clocked by a signal derived from the slave oscillator output signal. The processor circuit is powered by a supply voltage. The supply voltage has a desired specified tolerance range such as, for example, 1.0 volts maximum to 0.975 volts minimum. This tolerance range may sometimes be referred to using other terms such as the normal supply voltage operating range. If the supply voltage is in this specified tolerance range, then the processor circuit is to be clocked at its maximum rate by the slave oscillator output signal. The frequency of the clock signal supplied to the processor circuit should not exceed this maximum clock rate or malfunctions may occur. If, however, the supply voltage were to decrease such that the supply voltage would fall below its tolerance range (for example, fall below 0.975 volts), then clocking the processor circuit at this high rate may cause malfunctions. The maximum clock rate at which the processor circuit can operate without error decreases with decreasing supply voltage as the supply voltage decreases below the tolerance range. The supply voltage as the voltage is present on a supply voltage input lead of the processor circuit may, for example, drop due to a burst of heavy computation being performed by the processor circuit. The burst of heavy computation causes the processor circuit to draw a large surge of current from the source of the supply voltage and drawing the large surge of current through the finite impedance of the source may result in a drop in supply voltage at the processor circuit.

Accordingly, in one example, the unlock condition that is detected by the unlock condition detector circuit 5 is a condition in which the supply voltage has fallen below the tolerance range. The unlock condition detector circuit 5 detects this condition and in response deasserts the lock signal 10, which in turn causes injection lock control circuit 4 to decouple the slave oscillator 3 from the master oscillator 2, which in turn results in the frequency of the slave oscillator output signal 7 decreasing to its lower free running frequency, which in turn results in the frequency of the clock signal supplied to the processor circuit being decreased. When the supply voltage to the processor later increases and returns to its tolerance range, then the unlock condition detector circuit 5 detects this condition and asserts lock signal 10. In response to lock signal 10 being asserted, the opposite-phase condition detector circuit 9 waits until an opposite-phase condition and only then recouples the slave oscillator to the master oscillator. By recoupling the slave oscillator 3 to the master oscillator 2 in an opposite-phase condition, a frequency overshoot of the slave oscillator frequency is prevented. Accordingly, the frequency of the clock signal supplied to the processor circuit does not overshoot its maximum allowed clock rate. The frequency of the clock signal supplied to the processor circuit smoothly returns to the highest clock rate that is appropriate for operation of the processor circuit when the processor circuit is powered from a supply voltage in its tolerance range.

Figure 2:
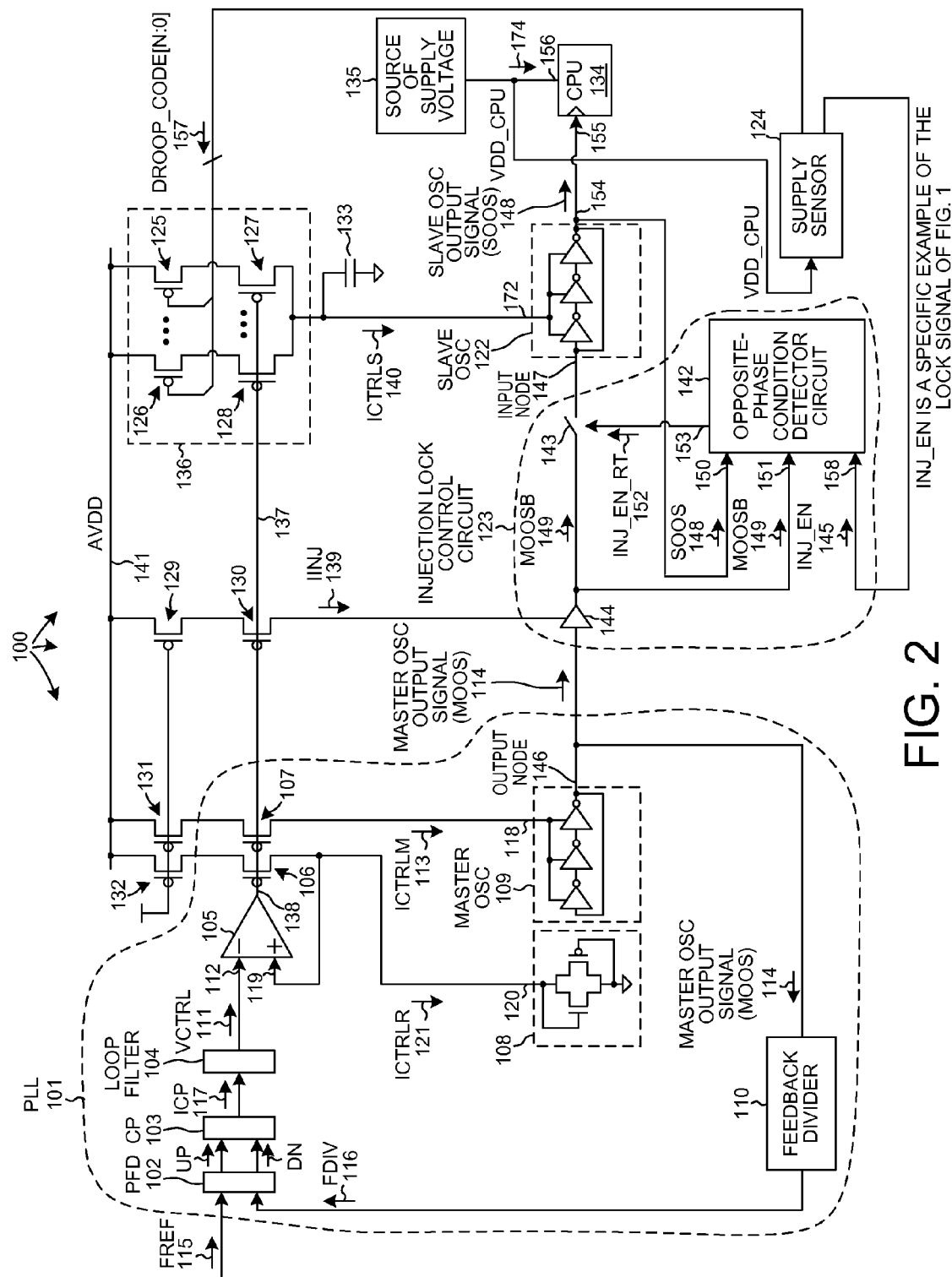
FIG. 2 is a circuit diagram of a specific example of the ILO system of FIG. 1.

FIG. 2 is a diagram of a specific example of system 1 of FIG. 1. An ILO system 100 includes a Phase-Locked Loop (PLL) 101. PLL 101 includes a Phase-to-Frequency Detector (PFD) 102, a Charge Pump (CP) 103, a loop filter 104, an operational amplifier 105, P-channel field effect transistors 106 and 107, a replica load circuit 108, a master oscillator 109, and a feedback divider 110.

Increasing a control voltage VCTRL 111 on an inverting input lead 112 of operational amplifier 105 results in a corresponding increase in a control current ICTRLM 113 supplied to the master oscillator 109. Increasing the supply current ICTRLM to the master oscillator causes the oscillating frequency of the master oscillator output signal (MOOS) 114 to increase. Similarly, decreasing the control voltage VCTRL 111 results in a decrease in control current ICTRLM 113 and an associated decrease in the oscillating frequency of the master oscillator output signal (MOOS) 114. Operational amplifier 105, transistors 106 and 107, replica load 108 and master oscillator 109 therefore together form a Voltage-Controlled Oscillator (VCO).

A reference signal FREF 115 is an input signal to the PLL 101. PFD 102 compares the phase of the reference signal FREF 115 and the phase of a feedback signal FDIV 116 and outputs UP pulses or DN pulses depending on whether the phase of FDIV leads or leads or lags the phase of FREF. Charge pump 103 converts the pulses into a control current signal ICP 117. Control signal ICP 117 is filtered by loop filter 104 and is converted into the control voltage signal VCTRL 111. The VCTRL signal 11 is sometimes referred to as a fine tune signal and is denoted VTUNE. As the PLL operates, the voltage of the control voltage signal VCTRL is adjusted to adjust the phase of the master oscillator output signal 114 such that the phase of signal FDIV 116 as received by PFD 102 matches and is locked to the phase of the reference signal FREF 115 as received by PFD 102.

Master oscillator 109 in the illustrated example is a ring oscillator made up of a ring of inverters. Master oscillator 109 receives control current ICTRL 113 via supply current input lead 118. The diagram of oscillator 109 is a simplified diagram. The control current ICTRLM 113 may be supplied to only a part of the master oscillator rather than to all the inverters of the ring as illustrated. Master oscillator output signal MOOS 114 has an oscillating frequency that is fairly directly proportional to the magnitude of the supply current ICTRLM 113 supplied to the oscillator.

Replica load 108 has a current-voltage characteristic (I-V characteristic) that substantially replicates the I-V characteristic of master oscillator 109. In one example, replica load 108 involves a diode-connected P-channel transistor that is connected in parallel with a diode-connected N-channel transistor as shown. These two transistors are sized such that the I-V characteristic across these parallel-connected transistors approximates the I-V characteristic of master oscillator 109. In another example, replica load 108 is actually a scaled version of the master oscillator being replicated. Alternatively, other ways of making a suitable replica load can be employed to realize replica load 108. Rather than having the inverting input lead 119 of the operational amplifier 105 coupled to the current control input lead 118 of the master oscillator itself, the replica load 108 is provided and the inverting input lead 119 is coupled to the corresponding current input lead 120 of the replica load. For a given I-V situation, the replica load supply current ICTRLR 121 is proportional to but is substantially smaller than the supply current ICRTLM 113 supplied to the master oscillator. The P-channel transistor 106 through which the ICTRLR current is supplied is therefore made smaller than the P-channel transistor 107 through which the ICTRLM current is supplied. Making the transistor in the supply regulation control of the operational amplifier smaller allows the parasitics of control loop to be reduced and improves control loop performance.

In addition to PLL 101, the ILO system 100 includes a slave oscillator 122, an injection lock control circuit 123, an unlock condition detector circuit 124 (in this case a supply sensor), a plurality of current sourcing P-channel transistors 125-132, a bypass capacitor 133, a processor circuit 134, and a source 135 of the supply voltage. Transistors 125-128 form a current sourcing circuit 136 for the slave oscillator 122. The gates of transistors 127, 128, 130, 107 and 106 are coupled together via conductor 137 and to the output lead 138 of operational amplifier 105. Accordingly, an increasing of the voltage on conductor 137 serves to increase all of currents ICTRLR 121, ICTRLM 113, IINJ 139, and ICTRLS 140. Similarly, a decreasing of the voltage on conductor 137 serves to decrease all of currents ICTRLR 121, ICTRLM 113, IINJ 139, and ICTRLS 140. Conductor 141 is a supply voltage conductor. The supply voltage AVDD on this conductor is a supply for the PLL and is a different voltage from VDD_CPU supplied to CPU 134.

Injection lock control circuit 123 includes an opposite-phase condition detector circuit 142, a switch 143, and an injector 144. Opposite-phase condition detector circuit 142 receives an injection enable INJ_EN digital control signal 145 from the supply sensor 124. If INJ_EN is deasserted to a digital logic low value, then opposite-phase condition detector circuit 142 controls switch 143 to be in the opened state. The slave oscillator 122 is not coupled and is not injection locked to the master oscillator 109 when switch 143 is in the opened state. The master oscillator output signal 114 cannot pass from the output node 146 of the master oscillator 109 through injector 144 and to the input node 147 of the slave oscillator 122. If, however, INJ_EN is asserted to a digital logic high value, then opposite-phase condition detector circuit 142 keeps the switch 143 in the opened state but checks the slave oscillator output signal SOOS 148 and the master oscillator output signal MOOS 114 for an opposite-phase condition between the two signals. (Opposite-phase condition detector circuit 142 in this case uses a buffered version of the master oscillator output signal MOOSB 149 rather than the master oscillator output signal MOOS 114 itself. The two signals MOOS and MOOSB may for purposes here be considered to be the same signal.) SOOS signal 148 is received by the opposite-phase condition detector circuit 142 via input lead 150. MOOSB signal 149 is received by the opposite-phase condition detector circuit 142 via input lead 151. INJ_EN signal 145 is received by the opposite-phase condition detector circuit 142 via input lead 158.

When an opposite-phase condition is detected, the opposite-phase condition detector circuit 142 asserts the retiming control signal INJ_EN_RT 152, thereby causing switch 143 to be closed in such a way that a frequency overshoot of the oscillating frequency of the slave oscillator output signal 148 does not occur. Opposite-phase condition detector circuit 142 outputs the INJ_EN_RT signal 152 via output lead and node 153. Closing switch 143 results in the slave oscillator 122 being coupled to the master oscillator 109 such that the slave oscillator 122 becomes injection locked to the master oscillator 109. When switch 143 is in its closed state, the master oscillator output signal MOOS 114 passes from output node 146, through injector 144, out of injector 144 in the form of buffered signal MOOSB 149, through switch 143, and onto the input node 147 of the slave oscillator 122.

The slave oscillator output signal 148 on output node 154 of the slave oscillator is supplied (either directly as shown or indirectly through intervening circuitry) to the clock input lead and node 155 of processor circuit 134. Processor circuit 134 in this example is a Central Processing Unit (CPU) that is called upon to perform heavy computations and other operations at times such that the amount of supply current 174 it draws is seen to increase in current surges. The supply voltage VDD_CPU supplied to the processor circuit 134 is sourced from source 135 onto a supply voltage input lead and node 156 of processor circuit 134. Under such a current surge condition, the magnitude of the supply voltage VDD_CPU on input lead and node 156 may decrease due to the finite impedance through which the current 174 flows within source 135. Supply sensor 124 monitors the magnitude of VDD_CPU on the supply voltage input lead and node 156. If the voltage of VDD_CPU falls below a first predetermined voltage, then supply sensor 124 deasserts the INJ_EN signal 145 to a digital logic low. If the voltage of VDD_CPU thereafter rises above a second predetermined voltage (such that VDD_CPU is again within its tolerance range for the processor circuit), then supply sensor 124 asserts the INJ_EN signal to a digital logic high. The second predetermined voltage is higher than the first predetermined voltage to provide hysteresis. In some examples, the second predetermined voltage is the same as the first predetermined voltage and there is no hysteresis.

In addition to detecting conditions when VDD_CPU has fallen below its tolerance range, the supply sensor 124 outputs a multi-bit digital value DROOP_CODE[N:0] 157. DROOP_CODE[N:0] is a digital value that is changed in proportion to changes in the magnitude of VDD_CPU. Decreasing DROOP_CODE[N:0] results in more of P-channel transistors 125-126 being on and conductive, whereas increasing DROOP_CODE[N:0] results in fewer of P-channel transistors 125-126 being on and conductive. Although only two transistors 125 and 126 are illustrated, there are actually N+1 such transistors, one for each bit of DROOP_CODE[N:0]. These transistors can be sized in a binary-weighted fashion. Accordingly, changing the value of DROOP_CODE[N:0] changes the control current ICTRLS 140 supplied to the slave oscillator (assuming a given voltage output by the operational amplifier), and this change in the control current ICTRLS 140 results in a change in the oscillating frequency of the slave oscillator output signal. When VDD_CPU is detected to be below the first predetermined voltage, supply sensor 124 deasserts INJ_EN to a digital logic low and also outputs the DROOP_CODE[N:0] such that the slave oscillating frequency varies proportionally with variations in VDD_CPU. If VDD_CPU increases, then the DROOP_CODE[N:0] is changed such that the oscillating frequency of the slave oscillator increases proportional to the increase in VDD_CPU. If VDD_CPU decreases, then the DROOP_CODE[N:0] is changed such that the oscillating frequency of the slave oscillator decreases proportional to the decrease in VDD_CPU.

Figure 3:
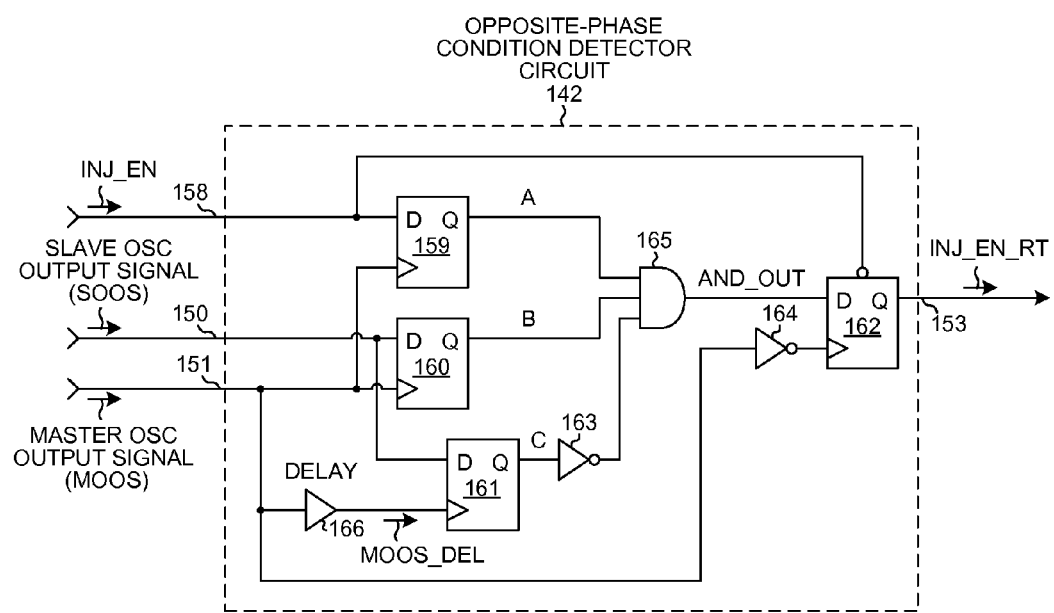
FIG. 3 is a circuit diagram of one specific example of the opposite-phase condition detector circuit of the ILO system of FIG. 2.

FIG. 3 is a diagram of one specific example of the opposite-phase condition detector circuit 142 of FIG. 2. Opposite-phase condition detector circuit 142 includes four flip-flops 159-162, two inverters 163 and 164, an AND gate 165, and a delay element 166.

FIG. 4 is a waveform diagram that illustrates an operation of the opposite-phase condition detector circuit 142 in an opposite-phase condition. The low-to-high propagation delay through delay element 166 defines a detection window of time 170 between a first time T1 that flip-flip 160 is clocked (on rising edge 167 of MOOS) and a second time T2 that flip-flop 161 is clocked (on rising edge 168 of MOOS_DEL). Flip-flop 160 captures the state of SOOS at the first time T1 and flip-flop 161 captures the state of SOOS at the second time T2. If flip-flop 160 captures a digital logic high (signal B is a digital logic high) and if flip-flop 161 captures a digital logic low (signal C is a digital logic low), this indicates a high-to-low transition 169 of SOOS occurred between the two times T1 and T2. Inverter 163 inverts the digital logic low of signal C so that the bottom two input lead of AND gate 165 are supplied with digital logic high values in the condition of a high-to-low SOOS edge occurring between the two times. Assuming that INJ_EN had transitioned high preceding the first time T1 (indicating that the slave oscillator is again to be coupled to the master oscillator), flip-flop 159 outputs a digital logic high value after being clocked on the rising edge 167 of MOOS (signal A is a digital logic high). Therefore all three input leads of AND gate 165 would be supplied with digital logic high signals after time T2. Signal AND_OUT is therefore asserted to a digital logic high shortly after time T2 as indicated in FIG. 4. On the next falling edge of MOOS at time T3, flip-flop 162 clocks in the value of AND_OUT. The signal INJ_EN_RT output by flip-flop 162 therefore transitions from a digital logic low (that corresponds to switch 143 being open) to a digital low high (that corresponds to switch 143 being closed) shortly after time T3 as illustrated in FIG. 4. The opposite-phase condition detector circuit 142 and switch 143 therefore operate to detect an opposite-phase condition between MOOS and SOOS and in response to the detecting of the opposite-phase condition couple the slave oscillator to the master oscillator.

FIG. 5 is a waveform diagram that illustrates an operation of the opposite-phase condition detector circuit 142 in an in-phase condition. In this situation, there is no falling edge of SOOS during the detection window 171 between a first time T4 defined by a rising edge of MOOS and a second time T5 defined by a corresponding rising edge of MOOS_DEL. Following time T5 not all the signals on the three input leads of AND gate 165 are digital logic high values, consequently signal AND_OUT is not a digital logic high value following time T5. Signal INJ_EN_RT therefore does not transition high at time T6 but rather remains low such that switch 143 remains open. Accordingly, in the in-phase condition of the MOOS and SOOS signals, the opposite-phase condition detector circuit 142 and the switch 143 do not couple the slave oscillator to the master oscillator.

Figure 6:
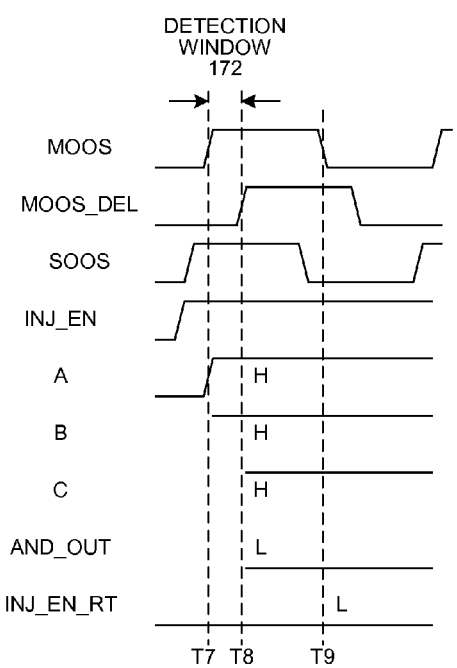
FIG. 6 is a waveform diagram that illustrates an operation of the opposite-phase condition detector circuit of FIG. 3 in a condition in which the slave oscillator output signal is at a digital logic high level throughout the detection window.

FIG. 6 is a waveform diagram that illustrates an operation of the opposite-phase condition detector circuit 142 in a condition in which SOOS rises before the detection window 172 and is at a digital logic high value throughout the detection window. Following time T8 not all the signals on the three input leads of AND gate 165 are digital logic high values, consequently signal AND_OUT is not a digital logic high value following time T8. Signal INJ_EN_RT therefore does not transition high at time T9 but rather remains low such that switch 143 remains open. Accordingly, in the condition of SOOS being high throughout the detection window 172 the opposite-phase condition detector circuit 142 and the switch 143 do not couple the slave oscillator to the master oscillator.

Figure 7:
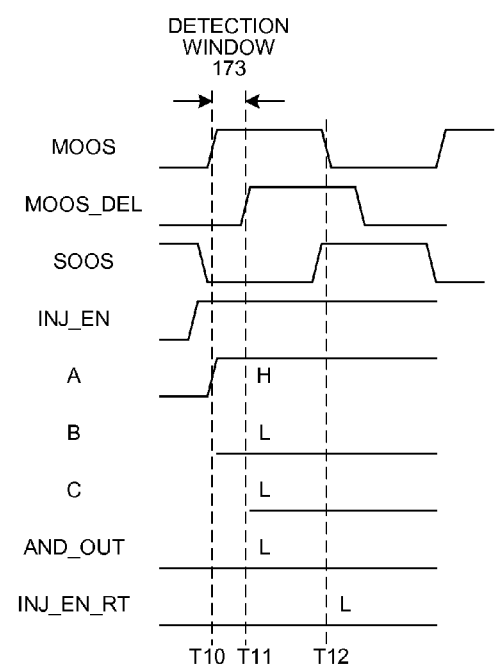
FIG. 7 is a waveform diagram that illustrates an operation of the opposite-phase condition detector circuit of FIG. 3 in a condition in which the slave oscillator output signal is at a digital logic low level throughout the detection window.

FIG. 7 is a waveform diagram that illustrates an operation of the opposite-phase condition detector circuit 142 in a condition in which SOOS falls before the detection window 173 and is at a digital logic low value throughout the detection window. Following time T11 not all the signals on the three input leads of AND gate 165 are digital logic high values, consequently signal AND_OUT is not a digital logic high value following time T11. Signal INJ_EN_RT therefore does not transition high at time T12 but rather remains low such that switch 143 remains open. Accordingly, in the condition of SOOS being low throughout the detection window 173 the opposite-phase condition detector circuit 142 and the switch 143 do not couple the slave oscillator to the master oscillator.

There are many ways that supply sensor 124 of FIG. 2 can be realized. In one example, supply sensor 124 includes a low power and low resolution Analog-to-Digital Converter (ADC) coupled to a clocked digital state machine. The digital state machine periodically reads a multi-bit output of the ADC and determines and outputs the multi-bit digital signal DROOP_CODE[N:0] as a function of the ADC output. The digital state machine may apply simple digital filtering to the ADC output values. In one example, the first and second predetermined voltages of VDD_CPU are software programmable by a processor such as CPU 134. Multi-bit digital values representing the first and second predetermined voltages are stored in processor-accessible registers in the supply sensor such that the digital state machine of the supply sensor can compare these values to the output of the ADC. Switch 143 can be realized in various ways including as a single N-channel transistor, as a single P-channel transistor, as a transmission gate, or as a tristatable logic element. The functionality of injector 144 and switch 143 is combined in some embodiments.

Figure 8:
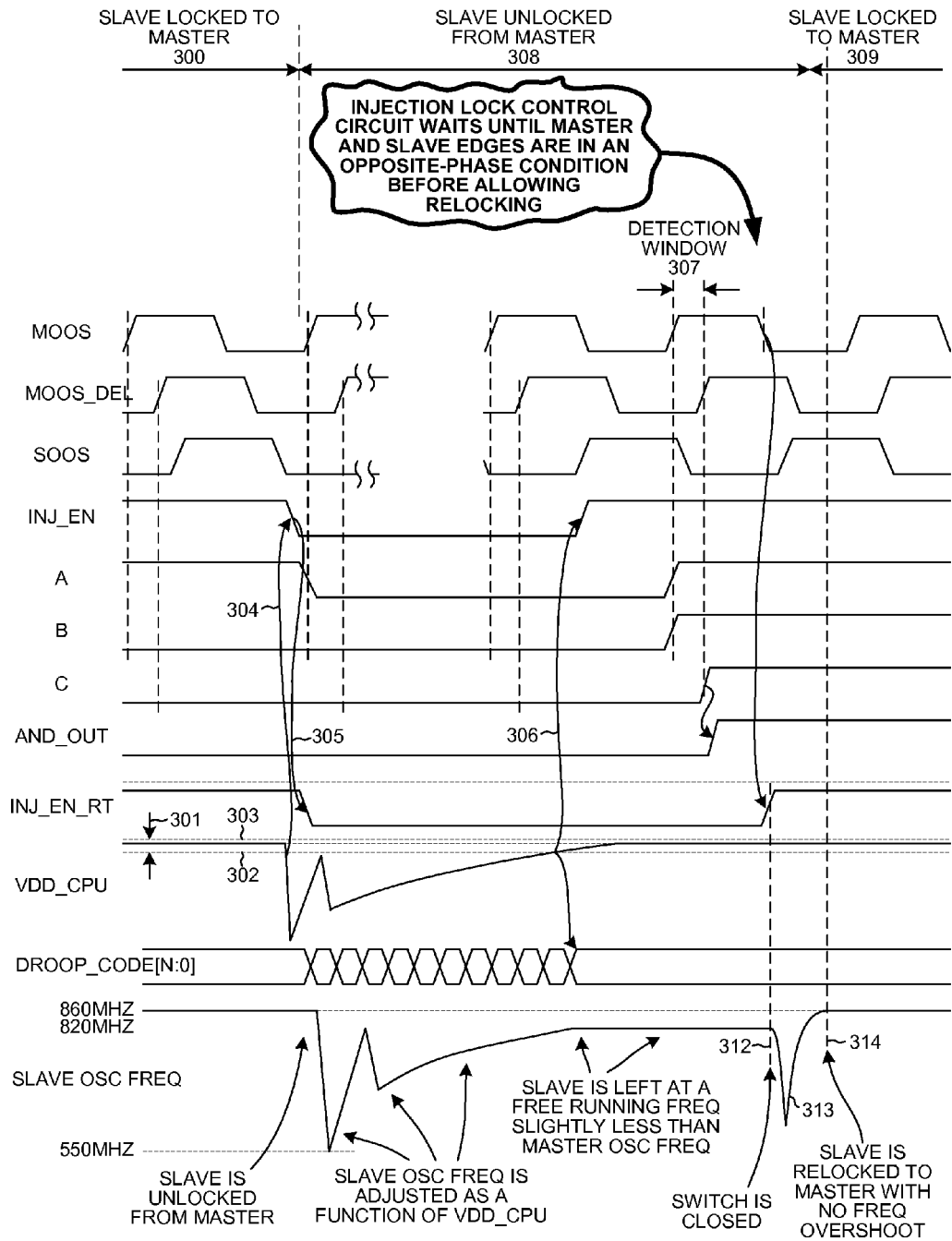
FIG. 8 is a waveform diagram that illustrates an operation of the ILO system of FIG. 2 in which the slave oscillator is decoupled and unlocked from the master, in which the oscillating frequency of the slave oscillator is then adjusted as a function of a supply voltage, and in which the slave oscillator is then recoupled to the master oscillator during an opposite-phase condition such that there is no frequency overshoot in the oscillating frequency of the slave oscillator during the relocking process.

FIG. 8 is a simplified waveform diagram that illustrates an operation of system 100 of FIG. 2. Initially during a period of time 300, the slave oscillator is coupled to and is injection-locked to the master oscillator. Signal INJ_EN_RT has a digital logic high value and switch 143 is in a closed state. Throughout this time the supply voltage VDD_CPU is in its tolerance range 301. Tolerance range 301 extends from a minimum voltage 302 (for example, 0.975 volts) to a maximum voltage 303 (for example, 1.0 volts.

Supply voltage VDD_CPU then drops and falls below tolerance range 301. This may be due to processor circuit 134 suddenly drawing an increased amount of supply current 174 from source 135. Supply sensor 124 detects VDD_CPU falling below its tolerance range and in response deasserts signal INJ_EN to a digital logic low. This action is represented by arrow 304. Signal INJ_EN transitioning low causes flip-flop 162 (see FIG. 3) to be asynchronously reset. INJ_EN_RT therefore transitions low. INJ_EN transitioning low causes INJ_EN_RT to transition low is indicated by arrow 305. INJ_EN_RT transitioning low causes switch 143 to open thereby decoupling the slave oscillator from the master oscillator.

In the present example, the oscillating frequency of the master oscillator is 860 MHz. When the slave oscillator is injection-locked to the master oscillator during time period 300, the slave oscillator oscillates at the master oscillator's oscillating frequency of 860 MHz as indicated by the lowest waveform labeled SLAVE OSC FREQ. The free-running oscillating frequency of the slave oscillator is, however, made to be a lower frequency of about 800 MHz. Once the slave oscillator is decoupled from the master oscillator as a consequence of INJ_EN_RT transitioning now, the oscillating frequency of the slave oscillator thereafter drops to its free running frequency of 800 MHz. Supply sensor 124 then adjusts DROOP_CODE[N:0] so that the free running oscillating frequency of the slave oscillator increases or decreases proportionally with increasing or decreasing VDD_CPU (i.e., the slave oscillating frequency tracks VDD_CPU with a small latency (time delay)). The clock rate with which processing circuit 134 is clocked is therefore maintained close to its maximum rate even though VDD_CPU varies up and down.

In the particular illustrated example, supply voltage VDD_CPU gradually rises and eventually recovers to the point that it is again in the tolerance range 301. Supply sensor 124 detects VDD_CPU being in the tolerance range and in response asserts injection enable signal INJ_EN to a digital logic high. This action of supply sensor 124 is indicated by arrow 306. Supply sensor 124 also stops changing DROOP_CODE[N:0] and leaves the value of DROOP_CODE such that the free running oscillating frequency of the slave oscillator is slightly lower than the oscillating frequency of the master oscillator. In the illustrated example, the slightly lower frequency is 820 MHz. This 820 MHz free running frequency of the slave oscillator in this example is different than the 800 MHz free running frequency of the slave oscillator immediately following unlocking. The frequency difference between these two oscillating frequencies 820 MHz and 800 MHz is due to different settings of the supply current transistors 125-126 by DROOP_CODE[N:0].

When signal INJ_EN transitions high, the opposite-phase condition detector circuit 142 is enabled to detect an opposite-phase condition. In the example illustrated in FIG. 8, the slave oscillator output signal (SOOS) has a high-to-low transition in the next detection window 307. Signal AND_OUT therefore transitions high at the end of the detection window, and INJ_EN_RT transitions high on the next falling edge of the master oscillator output signal (MOOS). Signal INJ_EN_RT transitioning high causes switch 143 to close at time 312, thereby coupling the slave oscillator to the master oscillator. A frequency undershoot 313 occurs and then the frequency of the slave oscillator output signal rises and by time 314 is at the 860 MHz master oscillator output signal. The slave oscillator is injection-locked to the master oscillator by time 314. Accordingly, the process of injection-locking the slave oscillator to the master oscillator occurs without any frequency overshoot. A frequency overshoot that would otherwise occur were the slave oscillator recoupled to the master oscillator in an in-phase condition does not occur. In FIG. 8, reference numeral 308 indicates the time during which the slave oscillator is unlocked from the master oscillator. Reference numeral 309 indicates the subsequent time during which the slave oscillator is again injection-locked to the master oscillator.

Figure 9:
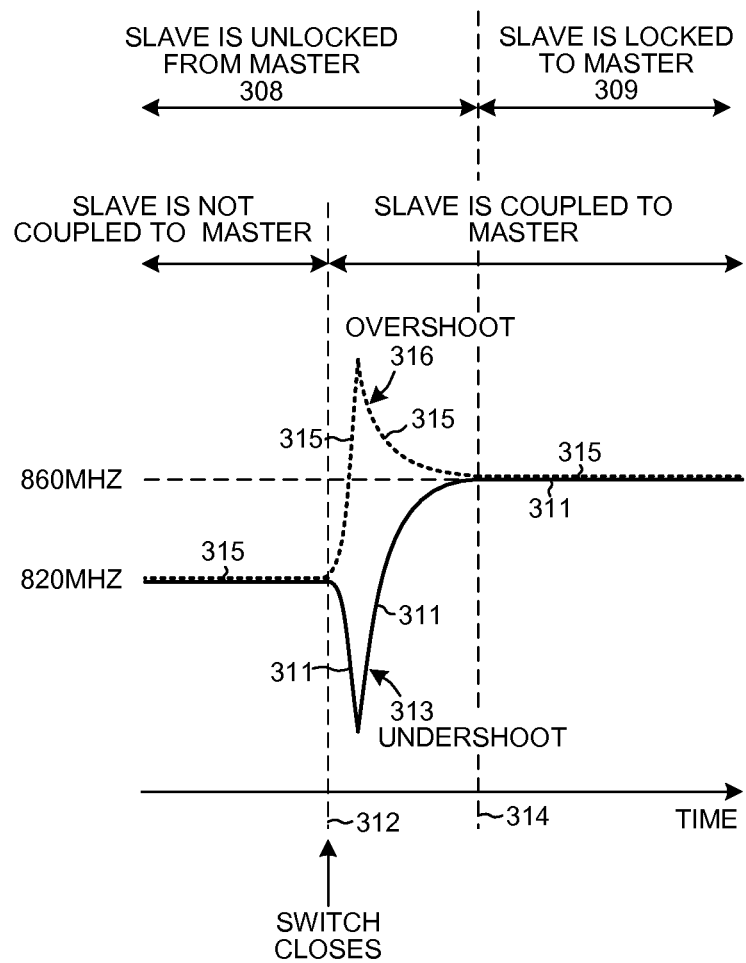
FIG. 9 is a waveform diagram that illustrates how the oscillating frequency of the slave oscillator output signal may overshoot if the slave oscillator is recoupled to the master oscillator during an in-phase condition, and how the oscillating frequency of the slave oscillator does not overshoot if the slave oscillator is recoupled to the master oscillator during an opposite-phase condition.

FIG. 9 is a diagram that illustrates how the oscillating frequency of the slave oscillator output signal changes in response to the coupling of the slave oscillator to the master oscillator. Line 311 represents the oscillating frequency of the slave oscillator output signal in the system 100 of FIG. 2. At the time 312 that the switch closes, the frequency of the slave oscillator output signal is only slightly lower (about 40 MHz lower) than the 860 MHz oscillating frequency of the master oscillator output signal. DROOP_CODE[N:0] is set so that this is the case. After the switch closes, there is a frequency undershoot condition 313. The frequency of the slave oscillator output signal then rises as illustrated and settles at the 860 MHz oscillating frequency of the master oscillator without any overshoot. At time 314 the slave oscillator is said to be locked to the master oscillator. Due to the use to which the slave oscillator output signal is put in clocking CPU 134, the frequency undershoot condition 313 is acceptable and does not cause malfunctioning in the circuit being clocked. A frequency overshoot, on the other hand, may have caused malfunctioning. Line 315 illustrates how the oscillating frequency of the slave oscillator output signal would have changed were the slave oscillator to have been recoupled to the master oscillator in an in-phase condition. After closing of the switch, a frequency overshoot condition 316 would have occurred. The frequency of the slave oscillator output signal would then have settled down to the frequency of the master oscillator output signal.

The system 100 of FIG. 2 differs from a conventional injection-locked oscillator in several ways. First, in a conventional injection-locked oscillator, there is no DROOP_CODE [N:0] that adjusts the free running frequency of the slave oscillator during an unlock period. The oscillating frequency of the slave oscillator in a conventional ILO may therefore be substantially different than the oscillating frequency of the master oscillator at the time relocking is initiated. In the system 100 of FIG. 2, on the other hand, the free running oscillating frequency of the slave oscillator is adjusted during the unlock period. It is also set such that it is only slightly (for example, 40 MHz or less) below the oscillating frequency of the master oscillator output signal at the time when the slave oscillator is recoupled to the master oscillator. Secondly, in a conventional injection-locked oscillator, the slave oscillator may be recoupled to the master oscillator during an in-phase condition such that a frequency overshoot in the slave oscillating frequency occurs. In the system 100 of FIG. 2, on the other hand, the injection lock control circuit 123 does not recouple the slave oscillator to the master oscillator in an in-phase condition so any frequency overshoots that otherwise might have been caused by an in-phase recoupling are avoided.

Figure 10:
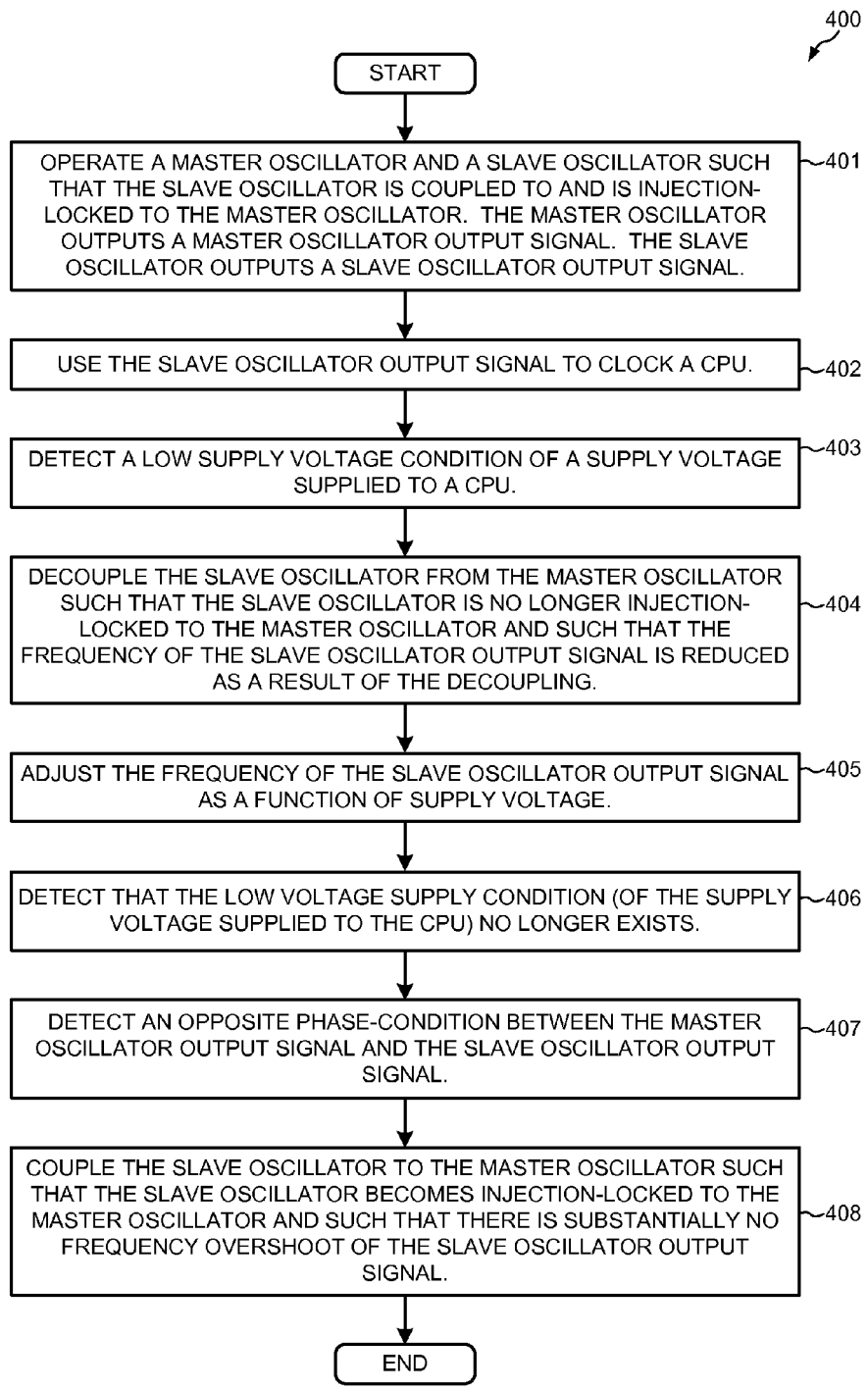
FIG. 10 is a flowchart of a method in accordance with one novel aspect.

FIG. 10 is a flowchart of a method 400 in accordance with one novel aspect. Initially (step 401), a master oscillator and a slave oscillator are operated such that the slave oscillator is coupled to and is injection-locked to the master oscillator. The slave oscillator output signal is used (step 402) to clock a CPU. The slave oscillator output signal can clock the CPU either directly or indirectly through other circuitry. The CPU is powered with a supply voltage. In the example of FIG. 2, the supply voltage is VDD_CPU that is supplied by source 135 to CPU 134. Next, a low supply voltage condition of the supply voltage is detected (step 403). In the example of FIG. 2, supply sensor 124 detects the low supply voltage condition and in response deasserts the signal INJ_EN to a digital logic low level. In response to the detecting of the low supply voltage condition, the slave oscillator is decoupled (step 404) from the master oscillator such that the slave oscillator is no longer injection-locked to the master oscillator and such that the oscillating frequency of the slave oscillator output signal is reduced as a result of the decoupling. In the example of FIG. 2, the oscillating frequency of the slave oscillator is reduced because the free running oscillating frequency of the slave oscillator is lower than the oscillating frequency of the master oscillator. With the slave oscillator decoupled from the master oscillator, the oscillating frequency of the free running slave oscillator is adjusted (step 406) as a function of the magnitude of the supply voltage. In the example of FIG. 2, the multi-bit digital value DROOP_CODE[N:0] is adjusted such that the oscillating frequency of the free running slave oscillator varies in proportion to the magnitude of VDD_CPU. Next, it is detected (step 406) that the low supply voltage condition no longer exists. In the example of FIG. 2, this detecting is done by supply sensor 124. When supply sensor 124 detects that the low supply voltage condition no longer exists, supply sensor 124 asserts the signal INJ_EN to a digital logic high value. An opposite-phase condition between the master oscillator output signal and the slave oscillator output signal is then detected (step 407). In the example of FIG. 2, the switch 143 remains in its open state until this detection occurs. In response to the detecting of the opposite-phase condition, the slave oscillator is again coupled (step 408) to the master oscillator such that the slave oscillator again becomes injection-locked to the master oscillator and such that there is substantially no frequency overshoot of the slave oscillator output signal.

Although certain specific embodiments are described above for instructional purposes, the teachings of this patent document have general applicability and are not limited to the specific embodiments described above. Although a specific example of the unlock condition detector circuit being a supply sensor is set forth above, the unlock condition detector circuit can be another type of unlock condition detector circuit that detects other types of unlock conditions in addition to and/or other than low voltage conditions of a supply voltage. Although a single digital signal is described above as the lock signal, an instruction to unlock and to lock as supplied to the injection lock control circuit can take other forms. The injection lock control circuit need not detect the opposite-phase condition between the master and slave oscillator output signals by receiving the master and slave output signals themselves, but rather the injection lock control circuit may detect the opposite-phase condition between the master and slave output signals indirectly through other signals (for example, from buffered versions of the master and slave oscillator output signals). Accordingly, various modifications, adaptations, and combinations of the various features of the described specific embodiments can be practiced without departing from the scope of the claims that are set forth below.

What is claimed is:

1. A method comprising:
   (a) injection-locking a slave oscillator to a master oscillator;
   (b) decoupling the slave oscillator from the master oscillator causing the slave oscillator to no longer be injection-locked to the master oscillator;
   (c) detecting an opposite-phase condition between a master oscillator output signal output by the master oscillator and a slave oscillator output signal output by the slave oscillator; and
   (d) in response to the detecting of (c), coupling the slave oscillator to the master oscillator to injection-lock the slave oscillator to the master oscillator.

2. The method of claim 1, wherein the detecting of (c) involves generating a signal indicative of whether an edge of the slave oscillator output signal falls within a predetermined time of an edge of the master oscillator output signal.

3. The method of claim 1, wherein the detecting of (c) involves generating a signal indicative of whether a falling edge of the slave oscillator output signal falls within a predetermined time of a rising edge of the master oscillator output signal.

4. The method of claim 3, wherein the predetermined time is a propagation delay of a digital signal through a digital circuit.

5. The method of claim 1, further comprising:
   after the decoupling of (b) and before the coupling of (d) adjusting an oscillating frequency of the slave oscillator.

6. The method of claim 5, wherein the adjusting involves adjusting a supply current supplied to the slave oscillator.

7. The method of claim 1, further comprising:
   detecting a condition of a supply voltage and in response to the detecting causing the decoupling of (b) to occur.

8. The method of claim 7, further comprising:
   supplying the slave oscillator output signal to a processor; and
   supplying the supply voltage to the processor.

9. The method of claim 1, wherein the coupling of (d) involves coupling an output node of the master oscillator to an input node of the slave oscillator via an injector circuit and a switch, wherein the switch is closed when the slave oscillator is coupled to the master oscillator in (d), and wherein the switch is open when the slave oscillator is decoupled from the master oscillator in (b).

10. The method of claim 1, wherein the slave oscillator output signal is a signal that is on an input node of the slave oscillator when the slave oscillator is oscillating, and wherein an output node of the master oscillator is coupled to the input node of the slave oscillator when the slave oscillator is coupled to the master oscillator in (d).

11. An apparatus comprising:
   a master oscillator that outputs a master oscillator output signal;
   a slave oscillator that outputs a slave oscillator output signal, the slave oscillator initially decoupled from the master oscillator; and an injection lock control circuit that detects an opposite-phase condition between the master oscillator output signal and the slave oscillator output signal and in response to the detecting of the opposite-phase condition couples the slave oscillator to the master oscillator to injection-lock the slave oscillator to the master oscillator.

12. The apparatus of claim 11, wherein the opposite-phase condition is a condition in which an edge of slave oscillator output signal occurs within a predetermined time of an edge of the master oscillator output signal, and wherein the edge of the slave oscillator output signal is of opposite phase to the edge of the master oscillator output signal.

13. The apparatus of claim 11, wherein the injection lock control circuit comprises:
   a switch through which the slave oscillator can be coupled to the master oscillator; and
   an opposite-phase condition detector circuit that supplies a control signal to the switch, wherein the opposite-phase condition detector circuit detects the opposite-phase condition and in response asserts the control signal.

14. The apparatus of claim 11, wherein the injection lock control circuit comprises:
   an injector coupled to receive the master oscillator output signal from the master oscillator;
   a switch that is controllable to couple an output node of the injector to an input node of the slave oscillator; and
   an opposite-phase condition detector circuit that supplies a control signal to the switch.

15. The apparatus of claim 11, further comprising:
   an unlock condition detector circuit that detects an unlock condition and in response to detecting the unlock condition deasserts a lock signal, wherein the lock signal is supplied to the injection lock control circuit.

16. The apparatus of claim 15, wherein the unlock condition detector circuit detects a low voltage condition of a supply voltage, and wherein the supply voltage is a supply voltage supplied to a processor.

17. The apparatus of claim 15, wherein during a period of time the slave oscillator is not injection-locked to the master oscillator, and wherein the unlock condition detector circuit adjusts an oscillating frequency of the slave oscillator during the period of time.

18. The apparatus of claim 11, further comprising:
   a processor that is clocked by the slave oscillator output signal.

19. The apparatus of claim 11, wherein the injection lock control circuit receives a lock signal and in response to an deasserting of the lock signal causes the slave oscillator to decouple from the master oscillator and not be injection-locked to the master oscillator, and wherein the injection lock control circuit then maintains the slave oscillator decoupled from the master oscillator until the lock signal is asserted.

20. The apparatus of claim 11, further comprising:
   a supply sensor that outputs a multi-bit digital control signal, wherein the multi-bit digital control signal causes an oscillating frequency of the slave oscillator to be adjusted during a time period in which the slave oscillator is not injection-locked to the master oscillator.

21. An apparatus comprising:
   a master oscillator;
   a slave oscillator that is initially decoupled from the master oscillator; and
   means for detecting an opposite-phase condition between a master oscillator output signal output by the master oscillator and a slave oscillator output signal output by the slave oscillator and in response to the detecting is also for coupling the slave oscillator to the master oscillator to injection-lock the slave oscillator to the master oscillator.

22. The apparatus of claim 21, wherein the means is also for decoupling the slave oscillator from the master oscillator in response to a deasserting of a lock signal, wherein the means is also for maintaining the slave oscillator decoupled from the master oscillator while the lock signal is deasserted, and wherein the means only couples the slave oscillator to the master oscillator during a time when the lock signal is asserted.

23. The apparatus of claim 21, wherein the means is also for adjusting an oscillating frequency of the slave oscillator during a period of time when the slave oscillator is not injection-locked to the master oscillator.

24. The apparatus of claim 21, further comprising:
   a processor that is clocked by the slave oscillator output signal.

25. The apparatus of claim 21, wherein the means for detecting comprises an injector, a switch, an opposite-phase condition detector circuit and an unlock condition detector circuit, wherein the switch is controllable by the opposite-phase condition detector circuit to couple an output node of the injector to an input node of the slave oscillator, and wherein the unlock condition detector circuit supplies a lock signal to the opposite-phase condition detector circuit.

* * * * *